(12) United States Patent
David et al.

(10) Patent No.: US 8,634,146 B2
(45) Date of Patent: Jan. 21, 2014

(54) METHOD OF MAKING A NANOSTRUCTURE

(75) Inventors: Moses M. David, Woodbury, MN (US);
Ta-Hua Yu, Woodbury, MN (US);
Andrew K. Hartzell, Hudson, WI (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 13/636,146

(22) PCT Filed: Apr. 22, 2011

(86) PCT No.: PCT/US2011/033536
§ 371 (c)(1),
(2), (4) Date: Sep. 20, 2012

(87) PCT Pub. No.: WO2011/139593
PCT Pub. Date: Nov. 10, 2011

(65) Prior Publication Data
US 2013/0038949 A1    Feb. 14, 2013

Related U.S. Application Data

(60) Provisional application No. 61/330,592, filed on May 3, 2010.

(51) Int. Cl.
*G02B 3/08* (2006.01)
*C23C 14/28* (2006.01)

(52) U.S. Cl.
USPC ....... 359/742; 204/192.34; 977/888; 977/891

(58) Field of Classification Search
CPC ........ B82Y 20/00; B82Y 30/00; B82Y 40/00; B29C 59/14; B29C 2059/023; G02B 1/118
USPC ....... 204/192.34; 359/742; 428/156; 977/888
See application file for complete search history.

(56) References Cited

U.S. PATENT DOCUMENTS

| | | |
|---|---|---|
| 4,374,158 A | 2/1983 | Taniguchi |
| 4,919,749 A | 4/1990 | Mauger |

(Continued)

FOREIGN PATENT DOCUMENTS

| | | |
|---|---|---|
| EP | 1 279 639 | 1/2003 |
| JP | S61-260621 A | 11/1986 |

(Continued)

OTHER PUBLICATIONS

Schulz, et al., "Antireflection of transparent polymers by advanced plasma etching procedures," Optics Express, vol. 15, No. 20, Oct. 1, 2007, 6 pages.

*Primary Examiner* — David N Spector
(74) *Attorney, Agent, or Firm* — Stephen L. Crooks

(57) ABSTRACT

A method of making a nanostructure is provided that includes applying a thin, random discontinuous masking layer (105) to a major surface (103) of a substrate (101) by plasma chemical vapor deposition. The substrate (101) can be a polymer, an inorganic material, an alloy, or a solid solution. The masking layer (105) can include the reaction product of plasma chemical vapor deposition using a reactant gas comprising a compound selected from the group consisting of organosilicon compounds, metal alkyls, metal isopropoxides, metal acetylacetonates, and metal halides. Portions (107) of the substrate (101) not protected by the masking layer (105) are then etched away by reactive ion etching to make the nanostructures.

19 Claims, 6 Drawing Sheets

(56) References Cited

U.S. PATENT DOCUMENTS

| | | |
|---|---|---|
| 5,888,594 A | 3/1999 | David |
| 6,440,858 B1 | 8/2002 | Canale |
| 8,460,568 B2 * | 6/2013 | David et al. ............... 216/67 |
| 2002/0018964 A1 | 2/2002 | Jerominek |
| 2005/0136663 A1 | 6/2005 | Terence Gan |
| 2005/0233083 A1 | 10/2005 | Schultz |
| 2006/0068127 A1 | 3/2006 | Melechko |
| 2009/0041986 A1 | 2/2009 | Zhang |
| 2009/0114618 A1 | 5/2009 | Zhang |
| 2009/0261063 A1 | 10/2009 | Munzert |
| 2010/0075114 A1 | 3/2010 | Kurihara |
| 2011/0281068 A1 | 11/2011 | David |
| 2012/0012557 A1 | 1/2012 | David |

FOREIGN PATENT DOCUMENTS

| | | |
|---|---|---|
| JP | H03-008798 A | 1/1991 |
| JP | H03-070123 A | 3/1991 |
| JP | 2008-001965 A | 1/2008 |
| JP | 2008-181912 A | 8/2008 |
| WO | WO 2004/044655 | 5/2004 |
| WO | WO 2010/078306 | 7/2010 |
| WO | WO 2011/109284 | 9/2011 |

\* cited by examiner

METHOD OF MAKING A NANOSTRUCTURE

FIELD

A method is provided for making nanostructures on surfaces.

BACKGROUND

Nanostructures have been found to impart useful properties on surfaces of articles. These useful properties include useful optical properties, such as, for example, reflection reduction of plastic substrates, useful mechanical properties, such as, for example, surface modification for improved adhesion, and for creating features on surfaces that can be useful in, for example, drug delivery.

Many methods exist to generate nanostructure on surfaces of articles. For example, plasma etching is a useful method that has been used to generate nanostructures. A type of plasma etching, reactive ion etching (RIE), has been widely employed in the semiconductor industry to produce submicron features useful in electronics. However, when the feature sizes reach below about 200 micrometers, charging effects of the surface features prevent pattern transfer of features having high aspect ratios. Recently, high density plasma processes have been developed that can produce nanostructures in the sub-100 micrometer range. The semiconductor industry is currently working on the fabrication of features with around 40 nm resolution using patterning and pattern transfer based on advanced plasma processing tools.

Known methods for creating the subwavelength surface structure tend to be complicated and expensive batch processes, however. For example, the method disclosed in U.S. Pat. Publ. No. 2005/0233083 (Schultz et al.) involves bombarding a polymeric surface with $Ar/O_2$ plasma under vacuum conditions of less than 0.5 mTorr. This requirement of extreme vacuum conditions limits the commercial viability of the method. U.S. Pat. No. 4,374,158 (Taniguchi et al.) describes a gas activation method for creating subwavelength surface structure. This batch process employs a plasma asher to isotropically etch samples in an oxygen-containing gas ambient. The resulting isotropically etched surfaces require an additional coating to provide durability.

Plasma treatment has also been used to produce antireflective surfaces on polymeric substrates, including transparent polymeric substrates. These treatments are all batch processes and can produce only limited antireflective regions on the substrates. There is a need for new methods of producing nanostructures on substrates. There is a need for new methods that are faster, more economical, and capable of producing nanostructures on large areas for uses, for example, on large displays. There is a need for methods to produce nanostructures on surfaces in a substantially continuous manner.

SUMMARY

The provided method is useful for creating nanostructures on substrates and articles in a continuous process. The provided method can be applied to large areas of substrates such as, for example, rolls of plastic substrates. Films and surfaces produced by the provided method can be useful, for example, in liquid crystal (LCD) or light-emitting-diode (LED) displays, for light extraction, for solar applications, for surface adhesion modification, and for chemical catalysis. The provided method can also produce surfaces that can be hydrophilic, hydrophobic, antistatic, conductive, antifogging, or even antimicrobial.

In one aspect, a method of making a nanostructure is provided that includes providing a substrate, applying a thin, random, discontinuous masking layer to a major surface of the substrate by plasma chemical vapor deposition, and etching portions of the major surface not protected by the masking layer to form a nanostructure on the substrate by reactive ion etching. In some embodiments, the substrate can include a polymer, a fiber, a glass, a composite or a microporous membrane. In some embodiments, the substrate can be transparent to visible light and can include polymers comprising a poly (methyl methacrylate), a poly(ethylene terephthalate), a polycarbonate, a triacetate cellulose, a cyclic olefin copolymer, a nylon, a polyimide, a fluoropolymer, a polyolefin, a polysiloxane, a siloxane copolymer, or a polyurethane.

In some embodiments, the masking layer comprises a compound selected from the group consisting of organosilicon compounds, metal alkyls, metal isopropoxides, metal oxides, metal acetylacetonates, and metal halides. Etching can be done with reactive ion etching using, in some embodiments, oxygen, fluorocarbons, nitrogen trifluoride, sulfur hexafluoride, chlorine, hydrochloric acid, methane, and combinations thereof as the gas. Typically, an inert carrier gas, such as argon, can be mixed in with the reactive ion etching gas. In some embodiments, the nanostructure can have a dimension of less than about 400 nanometers (nm). In other embodiments, the nanostructure can have a dimension of less than about 40 nm. Articles that have nanostructures made by the disclosed method are also provided.

In this disclosure:

"anisotropic" refers to having a height to width (that is, average width) ratio of about 1.5:1 or greater (preferably, 2:1 or greater; more preferably, 5:1 or greater);

"nanoscale" refers to submicron (for example, between about 1 nm and about 500 nm);

"nanostructured" refers to having one dimension on the nanoscale; and

"plasma" refers to a partially ionized gaseous or fluid state of matter containing electrons, ions, neutral molecules, and free radicals.

The nanostructured surfaces prepared by the provided method can exhibit a significant reduction in reflectance compared to an unstructured surface comprising the same materials. In addition, the nanostructured articles can be durable and possess scratch resistance. The provided method can be carried out at moderate vacuum conditions (for example, between about 5 mTorr and about 10 mTorr). The provided method can also be carried out as a roll-to-roll (that is, continuous) process. The provided method, therefore, meets the need in the art for a method of making AR surfaces that is relatively simple and inexpensive.

The above summary is not intended to describe each disclosed embodiment of every implementation of the present invention. The brief description of the drawings and the detailed description which follows more particularly exemplify illustrative embodiments.

DETAILED DESCRIPTION

Figure 1A:
FIGS. 1a-1c are sequential schematic views of an embodiment of an article made by the provided method.

In the following description, reference is made to the accompanying set of drawings that form a part of the description hereof and in which are shown by way of illustration several specific embodiments. It is to be understood that other embodiments are contemplated and may be made without departing from the scope or spirit of the present invention. The following detailed description, therefore, is not to be taken in a limiting sense.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

A method of making a nanostructure is provided that includes a substrate. In some embodiments, the substrate can be in the form of a flat, continuous film. In other embodiments, the substrate can be an article that has at least part of one surface upon which it is desired to create a nanostructure. The substrate or article can be made of any material that can be etched by the methods disclosed herein. For example, the substrate can be a polymeric material, an inorganic material, an alloy, or a solid solution. In some embodiments, the substrate can include a fiber, a glass, a composite, or a microporous membrane. Polymeric materials include thermoplastics and thermosetting plastics. Typical thermoplastics include, but are not limited to, polyethylene terephthalate (PET), polystyrene, acrylonitrile butadiene styrene, polyvinyl chloride, polyvinylidene chloride, polycarbonate, polyacrylates, thermoplastic polyurethanes, polyvinyl acetate, polyamide, polyimide, polypropylene, polyester, polyethylene, poly(methylmethacrylate), polyethylene naphthalate, polystyrene acrylonitrile, triacetate cellulose, nylon, silicone-polyoxamide polymers, fluoropolymers, cyclic olefin copolymers, and thermoplastic elastomers. Suitable thermosets include, but are not limited to, allyl resins, epoxies, thermosetting polyurethanes, and silicones or polysiloxanes. These resins can be formed from the reaction product of polymerizable compositions comprising at least one oligomeric urethane (meth)acrylate. Typically, the oligomeric urethane (meth)acrylate is multi(meth)acrylate. The term "(meth)acrylate" is used to designate esters of acrylic and methacrylic acids, and "multi(meth)acrylate" designates a molecule containing more than one (meth)acrylate group, as opposed to "poly(meth)acrylate" which commonly designates (meth)acrylate polymers. Most often, the multi(meth) acrylate is a di(meth)acrylate, but it is also contemplated to employ tri(meth)acrylates, tetra(meth)acrylates and so on. Oligomeric urethane multi(meth)acrylates may be obtained commercially, for example from Sartomer under the trade designation "PHOTOMER 6000 Series", such as "PHOTOMER 6010" and "PHOTOMER 6020", and also under the trade designation "CN 900 Series", such as "CN966B85", "CN964" and "CN972". Oligomeric urethane (meth)acrylates are also available from Surface Specialties, such as available under the trade designations "EBECRYL 8402", "EBECRYL 8807" and "EBECRYL 4827". Oligomeric urethane (meth)acrylates may also be prepared by the initial reaction of an alkylene or aromatic diisocyanate of the formula OCN—$R_3$—NCO with a polyol. Most often, the polyol is a diol of the formula HO—$R_4$—OH wherein $R_3$ is a $C_{2-100}$ alkylene or an arylene group and $R_4$ is a $C_{2-100}$ alkylene group. The intermediate product is then a urethane diol diisocyanate, which subsequently can undergo reaction with a hydroxyalkyl (meth)acrylate. Suitable diisocyanates include 2,2,4-trimethylhexylene diisocyanate and toluene diisocyanate. Alkylene diisocyanates are generally useful. A compound of this type may be prepared from 2,2,4-trimethylhexylene diisocyanate, poly(caprolactone)diol and 2-hydroxyethyl methacrylate. In at least some cases, the urethane (meth) acrylate can be aliphatic. Also included can be (meth)acrylate esters having other functionality. Compounds of this type are exemplified by the 2-(N-butylcarbamyl)ethyl (meth)acrylates, 2,4-dichlorophenyl acrylate, 2,4,6-tribromophenyl acrylate, tribromophenoxylethyl acrylate, t-butylphenyl acrylate, phenyl acrylate, phenyl thioacrylate, phenylthioethyl acrylate, alkoxylated phenyl acrylate, isobornyl acrylate and phenoxyethyl acrylate. The reaction product of tetrabromobisphenol A diepoxide and (meth)acrylic acid is also suitable.

The other monomer may also be a monomeric N-substituted or N,N-disubstituted (meth)acrylamide, especially an acrylamide. These include N-alkylacrylamides and N,N-dialkylacrylamides, especially those containing $C_{1-4}$ alkyl groups. Examples are N-isopropylacrylamide, N-t-butylacrylamide, N,N-dimethylacrylamide and N,N-diethylacrylamide. The other monomer may further be a polyol multi (meth)acrylate. Such compounds are typically prepared from aliphatic diols, triols, and/or tetraols containing 2-10 carbon atoms. Examples of suitable poly(meth)acrylates are ethylene glycol diacrylate, 1,6-hexanediol diacrylate, 2-ethyl-2-hydroxymethyl-1,3-propanediol triacylate (trimethylolpropane triacrylate), di(trimethylolpropane) tetraacrylate, pentaerythritol tetraacrylate, the corresponding methacrylates and the (meth)acrylates of alkoxylated (usually ethoxylated) derivatives of said polyols. Monomers having two or more (ethylenically unsaturated groups can serve as a crosslinker. Styrenic compounds suitable for use as the other monomer include styrene, dichlorostyrene, 2,4,6-trichlorostyrene, 2,4,6-tribromostyrene, 4-methylstyrene and 4-phenoxystyrene. Ethylenically unsaturated nitrogen heterocycles include N-vinylpyrrolidone and vinylpyridine. Useful inorganic materials for the substrate include, for example, glasses, metals, metal oxides, and ceramics. In some embodiments, inorganic materials include silicon, silicon oxide, germanium, zirconia, vanadium pentoxide, molybdenum, copper, titanium, titanium dioxide, gallium arsenide, diamond, aluminum oxide, silicon nitride, indium tin oxide, and tungsten carbide.

The provided method includes applying a thin, random, discontinuous masking layer to a major surface of the substrate using plasma chemical vapor deposition. The major surface of the substrate can be a flat side of a polymeric sheet or web. Alternatively, the major surface can be any surface of an article that can have enhanced optical, mechanical, electrical, adhesive, or catalytic properties by the production of nanostructures thereon. The random, discontinuous masking layer is the reaction product of plasma chemical vapor deposition using a reactant gas that includes a compound selected from organosilicon compounds, metal alkyls, metal isopropoxides, metal acetylacetonates and metal halides. Typically, the organosilicon compounds can include tetramethylsilane, trimethylsilane, hexamethyldisiloxane, tetraethylorthosilicate, or a polyhedral oligomeric silsesquioxane. Useful metal alkyls can comprise trimethylaluminum, tributylaluminum, tributyltin, or tetramethyl gallium. Useful metal isopropoxides can comprise titanium isopropoxide, or zirconium isopropoxide. Useful metal acetylacetonates can comprise platinum acetylacetonates, or copper acetylacetonate. Useful metal halides can comprise titanium tetrachloride, or silicon tetrachloride.

Plasma chemical vapor deposition (or plasma-enhanced chemical vapor deposition) is a process by which plasmas, typically generated by radio-frequency discharge, are formed in the space between two electrodes when that space is filled with a reacting gas or gases. Plasma chemical vapor deposition is done under vacuum to reduce side reactions from unwanted species being present in the reacting chamber. The reacting gas or gases typically deposit thin solid films on a substrate. In the provided method, a random, discontinuous masking layer is formed on the substrate using plasma chemical vapor deposition. It has been found that certain chemical species, when plasma deposited on a substrate in very short time form random, discontinuous islands of material. In one embodiment (see Example 1), when the reactive gas was tetramethylsilane and the substrate was poly(methyl methacrylate), the plasma chemical vapor deposition was performed at a web speed of from about 7 ft/min to about 9 ft/min (213 cm/min to 274 cm/min) at a pressure of about 10 mTorr and a plasma power of about 100-200 Watts to produce random, discontinuous islands of polymerized tetramethylsilane on the substrate.

Typically, when reactant gases derived from relatively small organic or organometallic compounds are plasma chemical vapor deposited on the provided substrates, they initially form small islands of reacted material. Although not wishing to be bound by theory, it is likely that this effect is similar to small amounts of liquids, such as water, initially beading up on a surface that has a different surface energy. In a similar manner, when small amounts of the product produced by plasma chemical vapor deposition initially deposit on the provided substrates they tend to huddle together in small islands that are initially in a random, discontinuous pattern. In the provided method, reaction conditions are adjusted (web speed, plasma discharge energy, time of substrate exposure, etc.) so as to halt the deposition before any coalescence occurs. The masking layer thus deposited is random and discontinuous. The individual islands typically have average dimensions of less than about 400 nm, less than about 200 nm, less than about 100 nm, less than about 50 nm or even less than about 20 nm.

The provided method includes etching portions of the major surface not protected by the masking layer to form a nanostructure on the substrate. Typically, reactive ion etching is used for the etching. In one embodiment, the provided method can be carried out using a continuous roll-to-roll process referred to as "cylindrical reactive ion etching" (cylindrical RIE). Cylindrical RIE utilizes a rotating cylindrical electrode to provide anisotropically etched nanostructures on the surface of a substrate or article. In general, cylindrical RIE can be described as follows. A rotatable cylindrical electrode ("drum electrode") powered by radio-frequency (RF) and a grounded counter-electrode are provided inside a vacuum vessel. The counter-electrode can comprise the vacuum vessel itself. An etchant gas is fed into the vacuum vessel, and a plasma is ignited and sustained between the drum electrode and the grounded counter-electrode.

A continuous substrate comprising a random, discontinuous masking layer can then be wrapped around the circumference of the drum and the substrate can be etched in the direction normal to the plane of the substrate. The exposure time of the substrate can be controlled to obtain a predetermined etch depth of the resulting nanostructure. The process can be carried out at an operating pressure of approximately 10 mTorr. Cylindrical RIE is disclosed, for example, in PCT Pat. App. No. US/2009/069662 (David et al.).

Figure 1B:
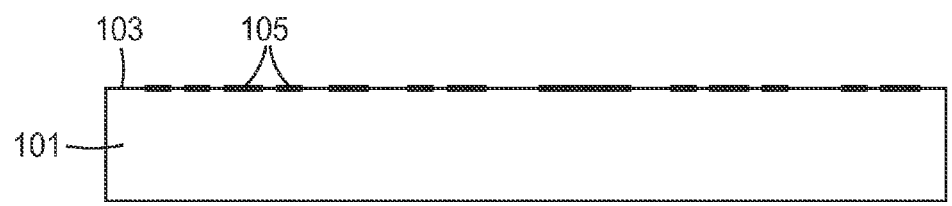
Figure 1C:
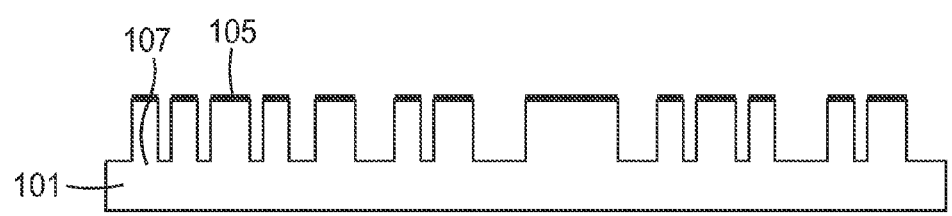

In another aspect, an article is provided that is made by the method described herein. FIGS. 1a-1c are sequential schematic views of an embodiment of an article made by the provided method. FIG. 1a is a schematic illustration of substrate 101 having major surface 103. FIG. 1b is a schematic illustration of the same article shown in FIG. 1a wherein discontinuous masking layer 105 is disposed upon major surface 103 of substrate 101. FIG. 1c is an illustration of the same article shown in FIG. 1b that includes discontinuous masking layer 105 disposed upon major surface 103 of substrate 101. Portions 107 of major surface 103 that are not protected by discontinuous masking layer 105 have been etched away leaving a nanostructure on substrate 101

Figure 2:
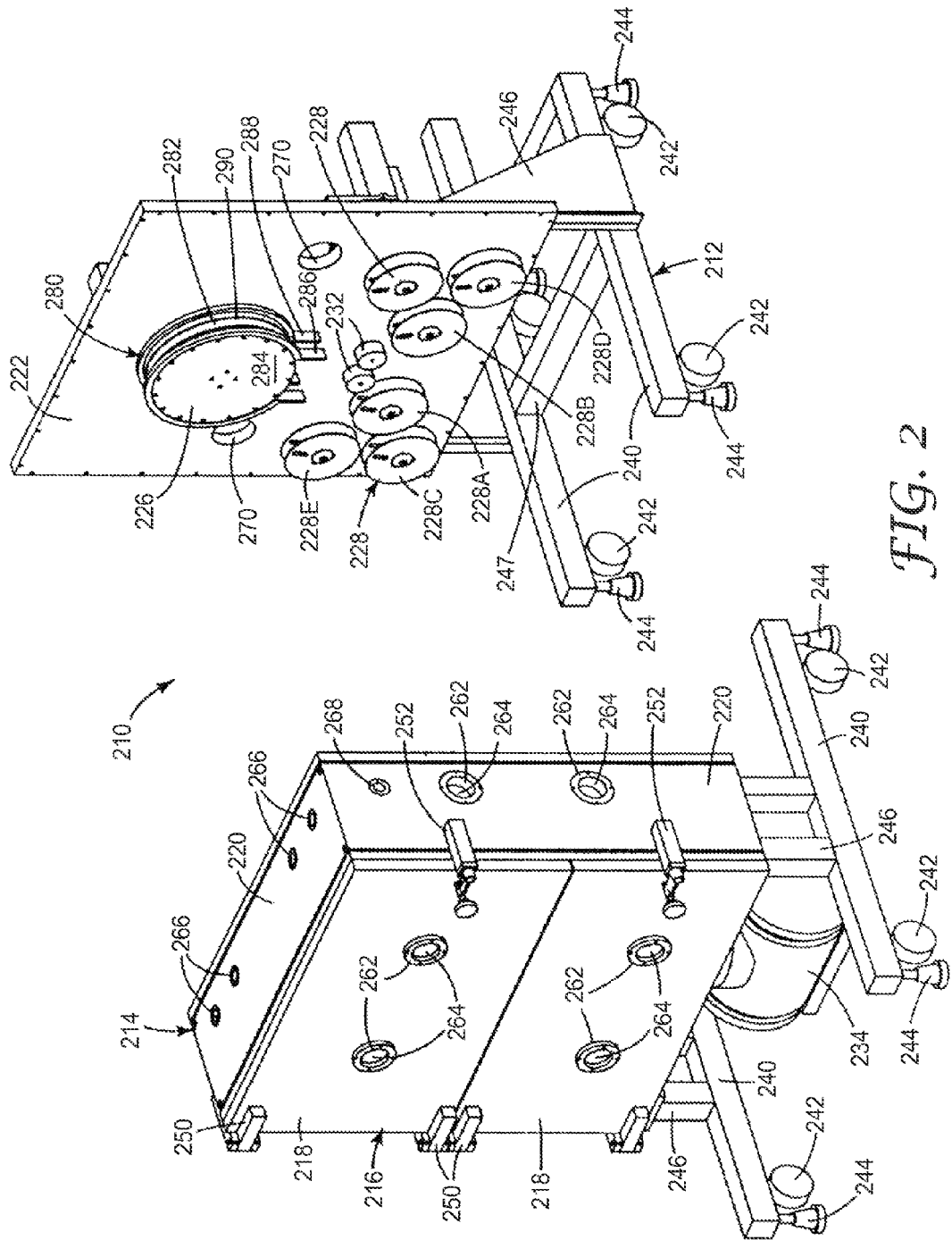
FIG. 2 is a first fragmentary perspective view of a coating apparatus useful in the present invention.
Figure 3:
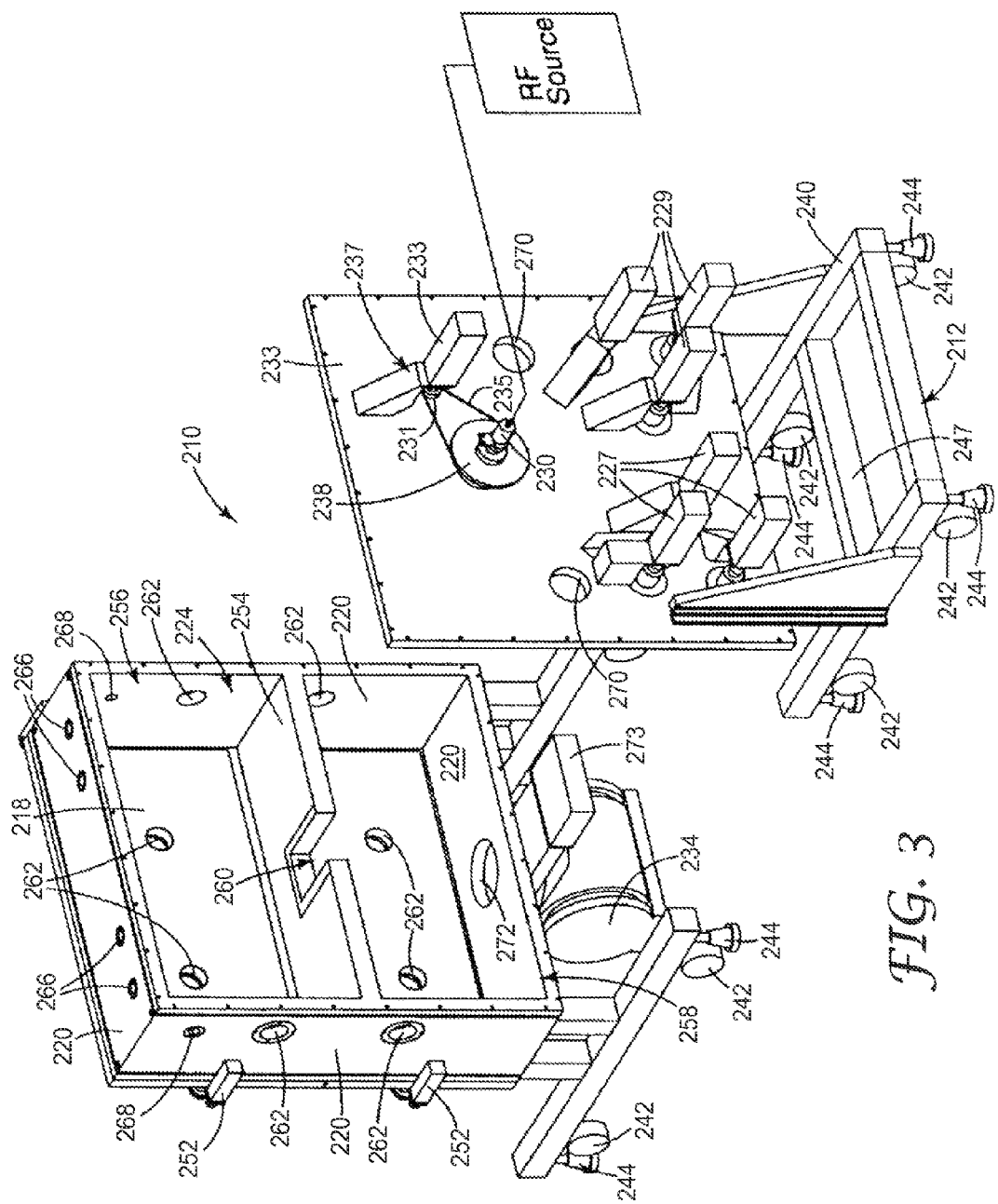
FIG. 3 is a second fragmentary perspective view of the apparatus of FIG. 1 taken from a different vantage point.

FIGS. 2 and 3 illustrate a cylindrical RIE apparatus that is useful for the method of the invention. A common element for plasma creation and ion acceleration is generally indicated as 210. This RIE apparatus 210 includes a support structure 212, a housing 214 including a front panel 216 of one or more doors 218, side walls 220 and a back plate 222 defining an inner chamber 224 therein divided into one or more compartments, a drum 226 rotatably affixed within the chamber, a plurality of reel mechanisms rotatably affixed within the chamber and referred to generally as 228, drive mechanism 237 for rotatably driving drum 226, idler rollers 232 rotatably affixed within the chamber, and vacuum pump 234 fluidly connected to the chamber.

Support structure 212 is any means known in the art for supporting housing 214 in a desired configuration, a vertically upright manner in the present case. As shown in FIGS. 2 and 3, housing 214 can be a two-part housing as described below in more detail. In this embodiment, support structure 212 includes cross supports 240 attached to each side of the two-part housing for supporting apparatus 210. Specifically, cross supports 240 include both wheels 242 and adjustable feet 244 for moving and supporting, respectively, apparatus 210. In the embodiment shown in FIGS. 2 and 3, cross supports 240 are attached to each side of housing 214 through attachment supports 246. Specifically, cross supports 240 are connected to one of side walls 220, namely the bottom side wall, via attachment supports 246, while cross supports 240 on the other side of housing 214 are connected to back plate 222 by attachment supports 246. An additional crossbar 247 is supplied between cross supports 240 on the right-hand side of apparatus 210 as shown in FIG. 2. This can provide additional structural reinforcement.

Housing 214 can be any means of providing a controlled environment that is capable of evacuation, containment of gas introduced after evacuation, plasma creation from the gas, ion acceleration, and etching. In the embodiment shown in FIGS. 2 and 3, housing 214 has outer walls that include front panel 216, four side walls 220, and a back plate 222. The outer walls define a box with a hollow interior, denoted as chamber 224. Side walls 220 and back plate 222 are fastened together, in any manner known in the art, to rigidly secure side walls 220 and back plate 222 to one another in a manner sufficient to allow for evacuation of chamber 224, containment of a fluid for plasma creation, plasma creation, ion acceleration, and etching. Front panel 216 is not fixedly secured so as to provide access to chamber 224 to load and unload substrate materials and to perform maintenance. Front panel 216 is divided into two plates connected via hinges 250 (or an equivalent connection means) to one of side walls 220 to define a pair of doors 218. These doors seal to the edge of side walls 220, preferably through the use of a vacuum seal (for example, an O-ring). Locking mechanisms 252 selectively secure doors 218 to side walls 220 and can be any mechanism capable of doors 218 to walls 220 in a manner allowing for evacuation of chamber 224, storage of a fluid for plasma creation, plasma creation, ion acceleration, and etching.

In one embodiment, chamber 224 is divided by a divider wall 254 into two compartments 256 and 258. A passage or hole 260 in wall 254 provides for passage of fluids or substrate between compartments. Alternatively, the chamber can be only one compartment or three or more compartments. Preferably, the chamber is only one compartment.

Housing 214 includes a plurality of view ports 262 with high pressure, clear polymeric plates 264 sealably covering ports 262 to allow for viewing of the etching process occurring therein. Housing 214 also includes a plurality of sensor ports 266 in which various sensors (for example, temperature, pressure, etc.) can be secured. Housing 214 further includes inlet ports 268 providing for conduit connection through which fluid can be introduced into chamber 224 as needed. Housing 214 also includes pump ports 270 and 272 that allow gases and liquids to be pumped or otherwise evacuated from chamber 224.

Pump 234 is shown suspended from one of sides 220, typically the bottom (as shown in FIG. 3). Pump 234 can be, for example, a turbo-molecular pump fluidly connected to the controlled environment within housing 214. Other pumps, such as diffusion pumps or cryopumps, can be used to evacuate lower chamber 258 and to maintain operating pressure therein. The process pressure during the etching step is preferably chosen to be between about 1 mTorr and about 20 mTorr (more preferably, between about 5 mTorr and about 10 mTorr) to provide anisotropic etching. Sliding valve 273 is positioned along this fluid connection and can selectively intersect or block fluid communication between pump 234 and the interior of housing 214. Sliding valve 273 is movable over pump port 262 so that pump port 262 can be fully open, partially open, or closed with respect to fluid communication with pump 234.

Drum 226 typically is a cylindrical electrode 280 with an annular surface 282 and two planar end surfaces 284. The electrode can be made of any electrically conductive material and preferably is a metal such as, for example, aluminum, copper, steel, stainless steel, silver, chromium or an alloy of any one or more of the foregoing. Preferably, the electrode is aluminum, because of the ease of fabrication, low sputter yield, and low costs.

Drum 226 is further constructed to include non-coated, conductive regions that allow an electric field to permeate outward as well as non-conductive, insulative regions for preventing electric field permeation and thus for limiting film coating to the non-insulated or conductive portions of the electrode. The electrically non-conductive material typically is an insulator, such as a polymer (for example, polytetrafluoroethylene). Various embodiments that fulfill this electrically non-conductive purpose so as to provide only a small channel, typically the width of the substrate to be coated, as a conductive area can be envisioned by one of ordinary skill in the art.

FIG. 2 shows an embodiment of drum 226 where annular surface 282 and end surfaces 284 of drum 226 are coated with an electrically non-conductive or insulative material, except for annular channel 290 in annular surface 282 which remains uncoated and thus electrically conductive. In addition, a pair of dark space shields 286 and 288 cover the insulative material on annular surface 282, and, in some embodiments, cover end surfaces 284. The insulative material limits the surface area of the electrode along which plasma creation and negative biasing may occur. However, since the insulative materials sometimes can become fouled by the ion bombardment, dark space shields 286 and 288 can cover part or all of the insulated material. These dark space shields may be made from a metal such as aluminum but do not act as conductive agents because they are separated from the electrode by means of an insulating material (not shown). This allows confinement of the plasma to the electrode area.

Figure 4A:
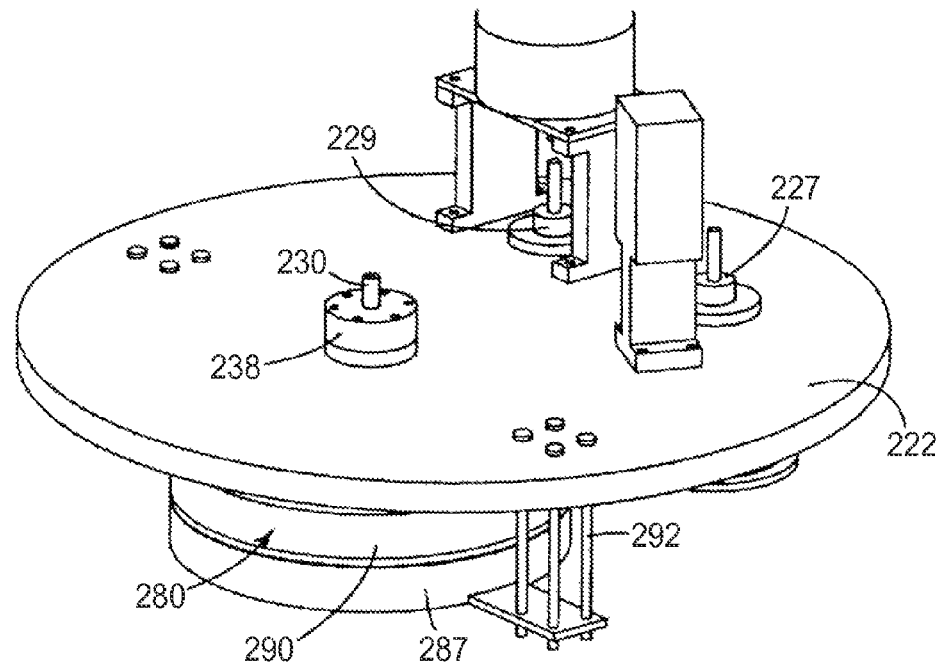
FIG. 4a is a fragmentary perspective view of another embodiment of the coating apparatus removed from its gas containing chamber.
Figure 4B:
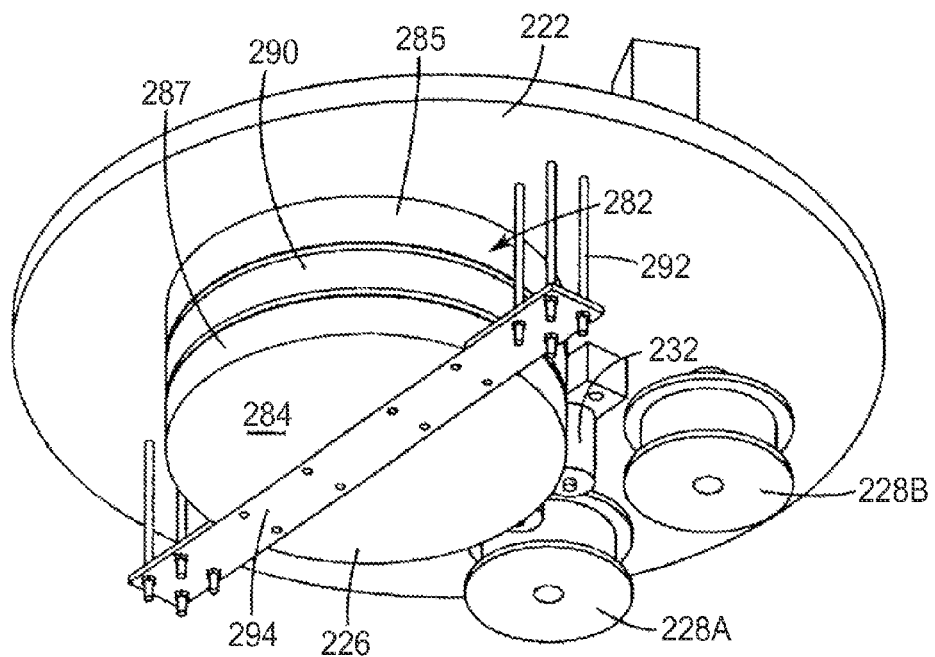
FIG. 4b is a second perspective view of the apparatus of FIG. 4a taken from a different vantage point.

Another embodiment of drum 226 is shown in FIGS. 4A and 4B where drum 226 includes a pair of insulative rings 285 and 287 affixed to annular surface 282 of drum 226. In some embodiments, insulative ring 287 is a cap which acts to also cover end surface 284. Bolts 292 secure support means 294, embodied as a flat plate or strap, to back plate 222. Bolts 292 and support means 294 can assist in supporting the various parts of drum 226. The pair of insulative rings 285 and 287, once affixed to annular surface 282, define an exposed electrode portion embodied as channel 290.

In any case, electrode 280 is covered in some manner by an insulative material in all areas except where the substrate contacts the electrode (that is, touching or within the plasma dark space limit of the electrode (for example, about 3 mm)). This defines an exposed electrode portion that can be in intimate contact with the substrate. The remainder of the electrode is covered by an insulative material. When the electrode is powered and the electrode becomes negatively biased with respect to the resultant plasma, this relatively thick insulative material prevents etching on the surfaces it covers. As a result, etching is limited to the uncovered area (that is, that which is not covered with insulative material, channel 290), which preferably is covered by relatively thin substrate material.

Referring to FIGS. 2 and 3, drum 226 is rotatably affixed to back plate 222 through a ferrofluidic feedthrough and rotary union 238 (or an equivalent mechanism) affixed within a hole in back plate 222. The ferrofluidic feedthrough and rotary union provide separate fluid and electrical connection from a standard coolant fluid conduit and electrical wire to hollow coolant passages and the conductive electrode, respectively, of rotatable drum 226 during rotation while retaining a vacuum seal. The rotary union also supplies the necessary force to rotate the drum, which force is supplied from any drive means such as a brushless DC servo motor. However, connection of drum 226 to back plate 222 and the conduit and wire may be performed by any means capable of supplying such a connection and is not limited to a ferrofluidic feedthrough and a rotary union. One example of such a ferrofluidic feedthrough and rotary union is a two-inch (about 5 cm) inner diameter hollow shaft feedthrough made by Ferrofluidics Co. (Nashua, N.H.).

Drum 226 is rotatably driven by drive mechanism 237, which can be any mechanical and/or electrical system capable of translating rotational motion to drum 226. In the embodiment shown in FIG. 3, drive mechanism 237 includes motor 233 with a drive shaft terminating in drive pulley 231 that is mechanically connected to a driven pulley 239 rigidly connected to drum 226. Belt 235 (or equivalent structure) translates rotational motion from drive pulley 231 to driven pulley 239.

The plurality of reel mechanisms 228 are rotatably affixed to back plate 222. The plurality of reel mechanisms 228 includes a substrate reel mechanism with a pair of substrate spools 228A and 228B, and, in some embodiments, also can include a spacing web reel mechanism with a pair of spacing web spools 228C and 228D, and masking web reel mechanism with a pair of masking web spools 228E and 228F, where each pair includes one delivery and one take-up spool. As is apparent from FIG. 3, at least each take-up spool 228B, 228D, and 228F includes a drive mechanism 227 mechanically connected thereto such as a standard motor as described below for supplying a rotational force that selectively rotates the reel as needed during etching. In addition, each spool 228A, 228C, and 228E in select embodiments includes a tensioner for supplying tautness to the webs and/or a drive mechanism 229.

Each reel mechanism includes a delivery and a take-up spool which may be in the same or a different compartment from each other, which in turn may or may not be the same compartment the electrode is in. Each spool is of a standard construction with an axial rod and a rim radially extending from each end defining a groove in which an elongated member, in this case a substrate or web, is wrapped or wound. Each spool is securably affixed to a rotatable stem sealably extending through back plate 222. In the case of spools to be driven, the stem is mechanically connected to a motor 227 (for example, a brushless DC servo motor). In the case of non-driven spools, the spool is merely coupled in a rotatable manner through a coupling 229 to back plate 222 and may include a tension mechanism to prevent slack.

RIE apparatus 210 also includes idler rollers 232 rotatably affixed within the chamber and pump 234 fluidly connected to the chamber. The idler rollers guide the substrate from the substrate spool 228A to channel 290 on drum 226 and from channel 290 to take-up substrate spool 228B. In addition, where spacing webs and masking webs are used, idler rollers 232 guide these webs and the substrate from substrate spool 228A and masking web spool 228E to channel 290 and from channel 290 to take-up substrate spool 228B and take-up masking web spool 228F, respectively.

RIE apparatus 210 further includes a temperature control system for supplying temperature controlling fluid to electrode 280 via ferrofluidic feedthrough 238. The temperature control system may be provided on apparatus 210 or alternatively may be provided from a separate system and pumped to apparatus 210 via conduits so long as the temperature control fluid is in fluid connection with passages within electrode 280. The temperature control system may heat or cool electrode 280 as is needed to supply an electrode of the proper temperature for etching. In a preferred embodiment, the temperature control system is a coolant system using a coolant such as, for example, water, ethylene glycol, chloro fluorocarbons, hydrofluoroethers, and liquefied gases (for example, liquid nitrogen).

RIE apparatus 210 also includes an evacuation pump fluidly connected to evacuation port(s) 270. This pump may be any vacuum pump, such as a Roots blower, a turbo molecular pump, a diffusion pump, or a cryopump, capable of evacuating the chamber. In addition, this pump may be assisted or backed up by a mechanical pump. The evacuation pump may be provided on apparatus 210 or alternatively may be provided as a separate system and fluidly connected to the chamber.

RIE apparatus 210 also includes a fluid feeder, preferably in the form of a mass flow controller that regulates the fluid used to create the thin film, the fluid being pumped into the chamber after evacuation thereof. The feeder may be provided on apparatus 210 or alternatively may be provided as a separate system and fluidly connected to the chamber. The feeder supplies fluid in the proper volumetric rate or mass flow rate to the chamber during etching. The etching gases can include, for example, oxygen, argon, chlorine, fluorine, carbon tetrafluoride, carbontetrachloride, perfluoromethane, perfluoroethane, perfluoropropane, nitrogen trifluoride, sulfur hexafluoride, methane, and the like. Mixtures of gases may be used advantageously to enhance the etching process.

Additional gases may be used for enhancing the etching rate of hydrocarbons or for the etching of non-hydrocarbon materials. For example, fluorine containing gases such as perfluoromethane, perfluoroethane, perfluoropropane, sulfurhexafluoride, nitrogen trifluoride, and the like can be added to oxygen or introduced by themselves to etch materials such as $SiO_2$, tungsten carbide, silicon nitride, amorphous silicon, and the like. Chlorine-containing gases can likewise be added for the etching of materials such as aluminum, sulfur, boron carbide, and the like. Hydrocarbon gases such as methane can be used for the etching of materials such as gallium arsenide, gallium, indium, and the like. Inert gases, particularly heavy gases such as argon can be added to enhance the anisotropic etching process.

RIE apparatus 210 also includes a power source electrically connected to electrode 280 via electrical terminal 230. The power source may be provided on apparatus 210 or alternatively may be provided on a separate system and electrically connected to the electrode via electrical terminal (as shown in FIG. 3). In any case, the power source is any power generation or transmission system capable of supplying sufficient power. (See discussion infra.)

Although a variety of power sources are possible, RF power is preferred. This is because the frequency is high enough to form a self bias on an appropriately configured powered electrode but not high enough to create standing waves in the resulting plasma. RF power is scalable for high output (wide webs or substrates, rapid web speed). When RF power is used, the negative bias on the electrode is a negative self bias, that is, no separate power source need be used to induce the negative bias on the electrode. Because RF power is preferred, the remainder of this discussion will focus exclusively thereon.

The RF power source powers electrode 280 with a frequency in the range of 0.01 to 50 MHz preferably 13.56 MHz or any whole number (for example, 1, 2, or 3) multiple thereof. This RF power as supplied to electrode 280 creates a plasma from the gas within the chamber. The RF power source can be an RF generator such as a 13.56 MHz oscillator connected to the electrode via a network that acts to match the impedance of the power supply with that of the transmission line (which is usually 50 ohms resistive) so as to effectively transmit RF power through a coaxial transmission line.

Upon application of RF power to the electrode, the plasma is established. In an 15 RF plasma the powered electrode becomes negatively biased relative to the plasma. This bias is generally in the range of 500 to 1400 volts. This biasing causes ions within the plasma to accelerate toward electrode 280. Accelerating ions etch the article in contact with electrode 280 as is described in more detail below.

In operation, a full spool of substrate upon which etching is desired is inserted over the stem as spool 228A. Access to these spools is provided through lower door 218 since, in FIGS. 2 and 3, the spools are located in lower compartment 258 while etching occurs in upper compartment 256. In addition, an empty spool is fastened opposite the substrate holding spool as spool 228B so as to function as the take-up spool after etching has occurred. If a spacer web is desired to cushion the substrate during winding or unwinding, spacer web delivery and/or take-up spool can be provided as spools 228C and 228D (although the location of the spools in the particular locations shown in the figures is not critical). Similarly, if etching is desired in a pattern or otherwise partial manner, a masking web can be positioned on an input spool as spool 228E and an empty spool is positioned as a take-up spool as spool 228F.

After all of the spools with and without substrates or webs are positioned, the substrate on which etching is to occur (and any masking web to travel therewith around the electrode) are woven or otherwise pulled through the system to the take-up reels. Spacer webs generally are not woven through the system and instead separate from the substrate just before this step and/or are provided just after this step. The substrate is specifically wrapped around electrode 280 in channel 290 thereby covering the exposed electrode portion. The substrate is sufficiently taut to remain in contact with the electrode and to move with the electrode as the electrode rotates so a length of substrate is always in contact with the electrode for etching. This allows the substrate to be etched in a continuous process from one end of a roll to the other. The substrate is in position for etching and lower door 218 is sealed closed.

Chamber 224 is evacuated to remove all air and other impurities. Once an etchant gas mixture is pumped into the evacuated chamber, the apparatus is ready to begin the process of etching. The RF power source is activated to provide an RF electric field to electrode 80. This RF electric field causes the gas to become ionized, resulting in the formation of a plasma with ions therein. This is specifically produced using a 13.56 MHz oscillator, although other RF sources and frequency ranges may be used. The power density of the RF power of the etching process is preferably in the range of about 0.1 to about 1.0 watts/cm$^3$ (preferably, about 0.2 to about 0.4 watts/cm$^3$).

Once the plasma has been created, a negative DC bias voltage is created on electrode 280 by continuing to power the electrode with RF power. This bias causes ions to accelerate toward annular channel 290 of electrode 280 (the remainder of the electrode is either insulated or shielded). The ions selectively etch the substrate material (versus the mask material) in the length of substrate in contact with channel 290 of electrode 280 causing anisotropic etching of the substrate material on that length of substrate.

For continuous etching, the take-up spools are driven so as to pull the substrate and any masking webs through the upper compartment 254 and over electrode 280 so that etching of the matrix occurs on any unmasked substrate portions in contact with annular channel 290. The substrate is thus pulled through the upper compartment continuously while a continuous RF field is placed on the electrode and sufficient reactive gas is present within the chamber. The result is a continuous etching on an elongated substrate, and substantially only on the substrate. Etching does not occur on the insulated portions of the electrode nor does etching occur elsewhere in the chamber. To prevent the active power fed to the plasma from being dissipated in the end plates of the cylindrical electrode, grounded dark space shields 286 and 288 can be used. Dark space shields 286 and 288 can be of any shape, size, and material that is conducive to the reduction of potential fouling. In the embodiment shown in FIGS. 2 and 3, dark space shields 286 and 288 are metal rings that fit over drum 226 and the insulation thereon. Dark space shields 286 and 288 do not bias due to the insulating material that covers drum 226 in the areas where dark space shields 286 and 288 contact drum 226. The dark space shields in this ring-like embodiment further include tabs on each end thereof extending away from drum 226 in a non-annular manner. These tabs can assist in aligning the substrate within channel 290.

Typically, the temperature control system pumps fluid through electrode 280 throughout the process to keep the electrode at a desired temperature. Typically, this involves cooling the electrode with a coolant as described above, although heating in some cases may be desirable. In addition, since the substrate is in direct contact with the electrode, heat transfer from the plasma to the substrate is managed through this cooling system, thereby allowing the coating of temperature sensitive films such as polyethyleneterephthalate, polyethylene naphthalate, and the like. After completion of the etching process, the spools can be removed from shafts supporting them on the wall. The nanostructured substrate is on spool 228B and is ready for use.

The surface of the substrate, itself, may be microstructured. For example, a thin, random, discontinuous masking layer can be applied to a major surface of a substrate with a v-groove microstructured surface by plasma chemical vapor deposition to form nanostructures on v-groove microstructured surface. Alternatively, a microstructured article such as Fresnel lens or a microstructured article comprising microreplicated posts or columns comprising nanodispersed phases can be also treated by plasma etching to form nanostructures on microstructures.

The nanostructured surface made by the method of the invention can have a nanostructured anisotropic surface. The nanostructured anisotropic surface typically can comprise nanoscale features having a height to width ratio or about 2:1 or greater; preferably about 5:1 or greater. In some embodiments, the height to width ratio can even be 50:1 or greater, 100:1 or greater, or 200:1 or greater. The nanostructured anisotropic surface can comprise nanofeatures such as, for example, nano-pillars or nano-columns, or continuous nano-walls comprising nano-pillars or nano-columns. Typically, the nanofeatures have steep side walls that are substantially perpendicular to the substrate. In some embodiments, the majority of the nanofeatures can be capped with mask material. The concentration of the mask material at the surface can be from about 5 weight % to about 90 weight % or from about 10 weight % to about 75 weight %.

In some embodiments, the substrate may comprise materials for static dissipation in order to minimize attraction of dirt and particulate and thus maintain surface quality. Suitable materials for static dissipation include, for example, STATRITE polymers such X-5091, M-809, S-5530, S-400, S-403, and S-680 (available from Lubrizol, Wickliffe, Ohio); 3,4-polyethylenedioxythiophene-polystyrenesulfonate (PEDOT/PSS) (available from H.C. Starck, Cincinnati, Ohio); polyanaline; polythiophene; and PELESTAT NC6321 and NC7530 antistatic additives (available from Tomen America Inc., New York, N.Y.).

The nanostructured articles made by the provided method can exhibit one or more desirable properties such as antireflective properties, light absorbing properties, antifogging properties, improved adhesion and durability. For example, in some embodiments, the surface reflectivity of the nanostructured anisotropic surface is about 50% or less than the surface reflectivity of an untreated surface. As used herein with respect to comparison of surface properties, the term "untreated surface" means the surface of an article comprising the same matrix material and the same nanodispersed phase (as the nanostructured surface of the invention to which it is being compared) but without a nanostructured anisotropic surface. In some embodiments, the percent reflection of the nanostructured anisotropic surface can be less than about 2% (typically, less than about 1%) as measured using the "Measurement of Average % Reflection" method described in the Example section below. Likewise, in some embodiments, the percent transmission of the nanostructured anisotropic surface can be about 2% or more than the percent transmission of an untreated surface as measured using the "Measurement of Average % Transmission" method described in the Example section below.

In other embodiments, the nanostructured anisotropic surface can have a water contact angle of less than about 20°, less than about 15°, or even less than about 10° as measured using the "Water Contact Angle Measurement" method described in the Example section below. In still other embodiments, the nanostructured anisotropic surface can absorb about 2% or more light than an untreated surface. In yet other embodiments of the invention, the nanostructured anisotropic surface can have a pencil hardness greater than about 2H (typically, greater than about 4H) as determined according to ASTM D-3363-05. In other embodiments, an article is provided that can be made in a continuous manner by the provided method so that the percentage of light (measured at 450 nm) transmitted through the localized nanostructured surface that is deflected more than 2.5 degrees from the direction of incoming beam is less than 2.0%, typically less than 1.0%, and more typically less than 0.5%.

Some embodiments of the invention further comprise a layer or coating comprising, for example, ink, encapsulant, adhesive, or metal attached to the nanostructured anisotropic surface. The layer or coating can have improved adhesion to the nanostructured anisotropic surface of the invention than to an untreated surface.

The nanostructured articles made by the method of the invention are useful for numerous applications including, for example, display applications (for example, liquid crystal displays (LCD), light emitting diode (LED) displays, or plasma displays); light extraction; electromagnetic interference (EMI) shielding, ophthalmic lenses; face shielding lenses or films; window films; antireflection for construction applications, construction applications or traffic signs; and the like. The nanostructured articles are also useful for solar applications such as solar films and Fresnel lenses. They can be used as the front surface and/or secondary surface of solar thermal hot liquid/air heat panels or any solar energy absorbing device; for solar thermal absorbing surfaces having micro- or macro-columns with additional nanoscale surface structure; for the front surface of flexible solar photovoltaic cells made with amorphous silica photovoltaic cells or CIGS photovoltaic cells; and for the front surface of a film applied on top of flexible photovoltaic cells.

In another embodiment of the invention, the mask material dispersed on the substrate can be etched away using plasma to form a nanostructured (or nanoporous) surface. This method can be carried out using cylindrical RIE essentially as described above, but using etching selectivity to favor etching the dispersed material rather than the substrate (that is, by selecting gases that etch dispersed phase material rather than the substrate material).

Objects and advantages of this invention are further illustrated by the following examples, but the particular materials and amounts thereof recited in these examples, as well as other conditions and details, should not be construed to unduly limit this invention.

EXAMPLES

The provided nanostructures and methods described herein were obtained by using a homebuilt plasma treatment system described in detail in U.S. Pat. No. 5,888,594 (David et al.) with some modifications and is illustrate in FIGS. 2, 3, and 4ab. The width of the drum electrode was increased to 14.5 inches (36.8 cm) and the separation between the two compartments within the plasma system was removed so that all the pumping was carried out by means of the turbo-molecular pump and thus operating at a much lower operating pressure than is conventionally done with plasma processing.

Rolls of polymeric film were mounted within the chamber, the film wrapped around the drum electrode and secured to the take up roll on the opposite side of the drum. The unwind and take-up tensions were maintained at 3 pounds (13.3 N). The chamber door was closed and the chamber pumped down to a base pressure of $5 \times 10^{-4}$ torr. For the deposition of an discontinuous mask layer, tetramethylsilane gas at a flow rate of 50 sccm was mixed with argon gas at a flow rate of 450 sccm. The pressure during the deposition step was around 10 mTorr and plasma was turned on at a power of either 100 watts or 200 watts depending upon the example and the substrate was exposed to the plasma for a predetermined time period either by recording the time in the case of sheet samples taped to the drum or by adjusting the web speed to provide a certain residence time in the plasma while the substrate web is treated continuously. For the etching step, pure oxygen gas was introduced at a flow rate of 400 sccm and the operating pressure was nominally 10 mTorr. Plasma was turned on at a power of 2000 watts by applying rf power to the drum and the drum rotation initiated so that the film was transported at a desired speed stated in the following examples. In the case of stationary samples, the etching depth was controlled by the etching time.

Measurement of Average % Reflection

The average % reflection (% R) of the plasma treated surface was measured using BYK Gardiner color guide sphere. One sample of each film was prepared by applying Yamato Black Vinyl Tape #200-38 (obtained from Yamato International Corporation, Woodhaven, Mich.) to the backside of the sample. Clear glass slide of which transmission and reflection from both sides were predetermined was utilized to establish the % reflection from the black tape. The black tape was laminated to the backside of the sample using a roller to ensure there were no air bubbles trapped between the black tape and the sample. To measure the front surface total % reflection (specular and diffuse) by an integrating sphere detector, the sample was placed in the machine so that the non-tape side was against the aperture. The % reflection was measured at a 10° incident angle and average % reflection was calculated by subtracting the % reflection of the black tape for the wavelength range of 400-700 nm.

Measurement of Haze and Transmission

Measurement of haze and transmission was carried out with BYK Haze-Gard Plus (from BYK Gardiner, Columbia, Md.) according to ASTM D1003 & D1004.

Water Contact Angle Measurement

Water contact angle was measured with a static contact angle measurement device. The machine is equipped with a digital camera, automatic liquid dispensers, and sample stages allowing hands-free contact angle via automated placement of a drop of water. The drop shape is captured automatically and then analyzed via Drop Shape Analysis by a computer to determine the static contact angle.

Examples 1-8

Nanostructure Formed on PMMA Substrate Film

PMMA film sheets were first exposed to a tetramethylsilane (TMS) plasma at a web speed of either 7.5 feet/min (2.3 m/min) or 8.5 feet/min (2.6 m/min) and the oxygen etching was carried out for four different, 30, 60, 90 and 120 seconds. The resulting sheet articles demonstrated outstanding average % transmission and anti-reflection (average % reflection) properties as summarized in Table 1 below:

TABLE 1

Optical Properties of Nanostructured PMMA films (Examples 1-8)

| Example | % R (without tape correct) | % R (tape correct) | % T | % H | TMS/AR deposition (m/min) | RIE Etching Time |
|---|---|---|---|---|---|---|
| 1 | 2.43 | 1.85 | 96.1 | 2.38 | 2.6 | 120 |
| 2 | 1.33 | 0.76 | 97.1 | 1.36 | 2.6 | 90 |
| 3 | 1.36 | 0.78 | 97.2 | 0.74 | 2.6 | 60 |
| 4 | 2.44 | 1.87 | 96.3 | 0.48 | 2.6 | 30 |
| 5 | 1.13 | 0.56 | 96.5 | 2.15 | 2.3 | 120 |
| 6 | 0.98 | 0.41 | 96.7 | 1.62 | 2.3 | 90 |
| 7 | 1.22 | 0.64 | 97.3 | 0.74 | 2.3 | 60 |
| 8 | 4.32 | 3.75 | 95.8 | 0.59 | 2.3 | 30 |

Figure 5:
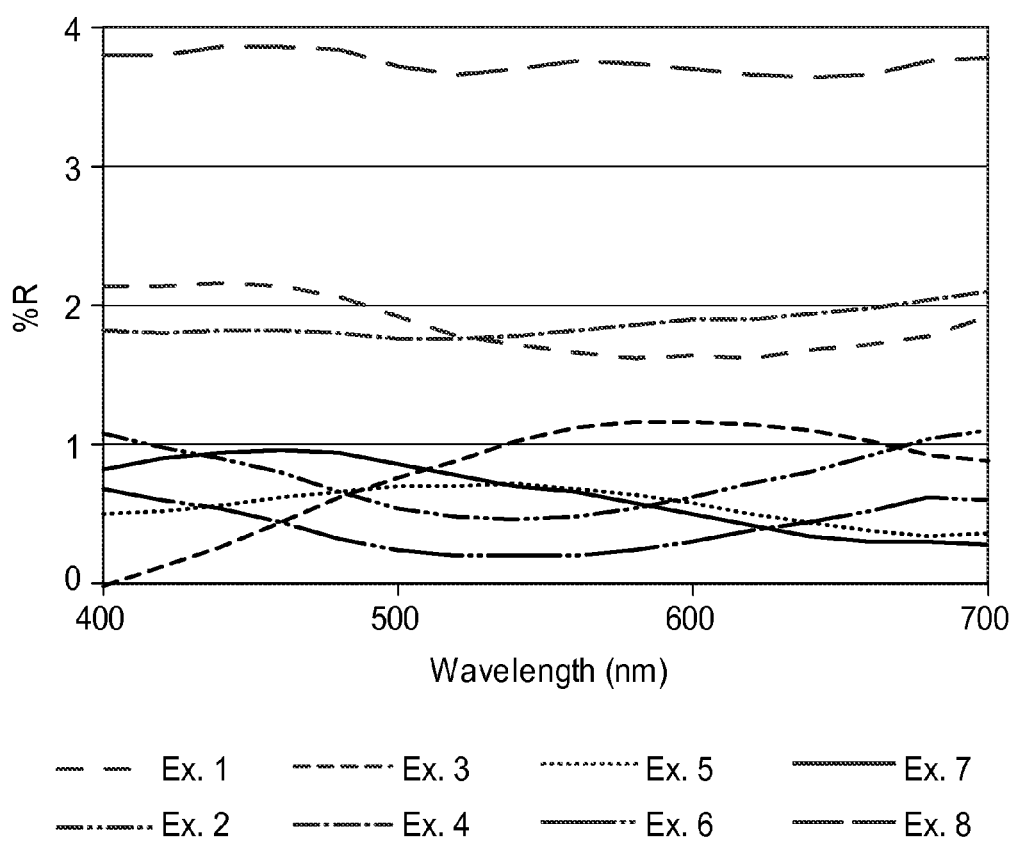
FIG. 5 is a graph of reflectance vs. wavelength for embodiments of articles made according to the provided method.

The optical reflectance spectra of these films are summarized in FIG. 5, where the broad-band anti-reflection performance is displayed.

Figure 6A:
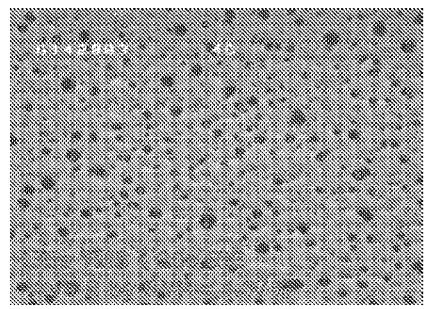
FIG. 6a-6d are photomicrographs of the surface of articles made according to the provided method.
Figure 6B:
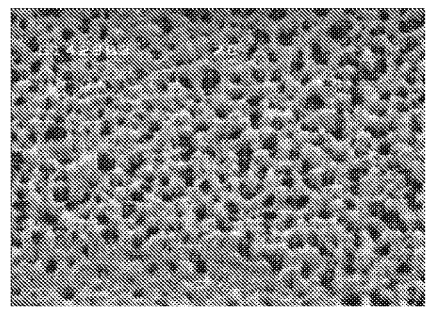
Figure 6C:
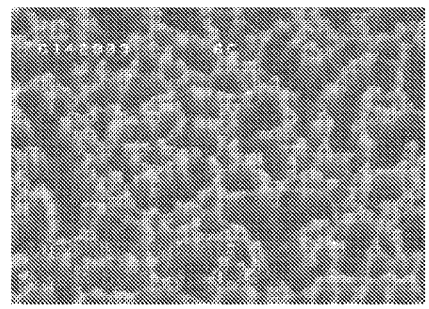
Figure 6D:
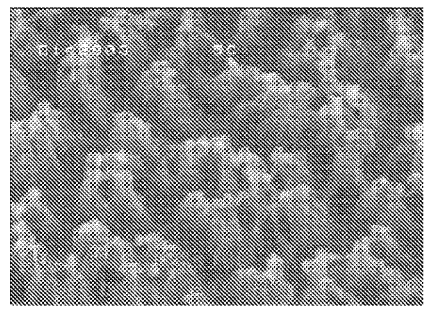

The surface morphology of the PMMA films of was determined by SEM analysis and the results are shown in FIGS. 6a-6d. FIG. 6a is a photomicrograph of Example 4, FIG. 6b is a photomicrograph of Example 7, FIG. 6c is a photomicrograph of Example 6, and FIG. 6d is a photomicrograph of Example 5. Filament/fiber like nanostructures are seen with 10-40 nm diameter and length of 100-400 nm. Example 4, which has only been etched for 30 seconds, shows the least amount of nanostructure. The other Examples displayed (Examples 7, 6, and 5) all have significant nanostructures. These nanostructures are also random in nature as Comparative Example 9 and Examples 10 to 12

Acrylic Fresnel Lens Film is Used in High Concentration Photo-Voltaic Systems to Focus Light onto Solar Cells for Power Generation Fresnel lens film (3M Radical Concentrating Lens Film, available from 3M, St. Paul, Minn., was coated with TMS and then etched in a pure oxygen plasma at a power density of 0.4 W/cm$^2$ for 90 seconds at a pressure of 8 mTorr to create nano-structures on top of the micro-structured facets of the lenses in order to increase transmission of these lenses. Flat acrylic blanks were used as Comparative Example 9. Transmission measurements (average % transmission) shown here were made on a Lambda 950 spectrometer, with the sample positioned for specular transmission using a PELA9042 variable-angle transmittance sample holder, available from PerkinElmer, Waltham, Mass.

TABLE 2

Microstructure on Acrylic Fresnel Lenses

| Example | Description | Surfaces Treated | Results |
|---|---|---|---|
| 9 | Flat acrylic blanks | Two sides | 4% transmission improvement |
| 10 | Individual Fresnel Lenses | Two sides | 3-6% transmission improvement. Increased transmission in blue region. |
| 11 | Fresnel Lens Film Roll | Faceted Side Only | 2-3% transmission improvement |

In Example 10, the Fresnel Lens film was treated on both sides (flat and faceted sides) and tested in a Lambda 950 spectrometer. Transmission on these samples increased up to 6% from the untreated sample as shown in Table 2.

Typical acrylic Fresnel lens films typically represent 10% of the cost of a complete solar panel system and cause 10%-15% of the power loss depending on the optical design, mainly through reflections from optical surfaces. Reducing this optical loss by 1% can have the leverage to reduce the cost of power produced by 1%, if it can be delivered without a large increase in lens cost. These results show that the formation of nanostructure on Fresnel lens films used on solar collectors can achieve this desired result.

Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows. All references cited in this disclosure are herein incorporated by reference in their entirety.

What is claimed is:

1. A method of making a nanostructure, comprising:
   providing a substrate;
   applying a thin, random, discontinuous masking layer to a major surface of the substrate by plasma chemical vapor deposition; and
   etching portions of the major surface not protected by the masking layer to form a nanostructure on the substrate by reactive ion etching.

2. A method of making a nanostructure according to claim 1, wherein the reactive ion etching comprises using a gas selected from oxygen, fluorocarbons, nitrogen trifluoride, sulfur hexafluoride, chlorine, hydrochloric acid, methane, and combinations thereof.

3. A method of making a nanostructure according to claim 1, performed in a substantially continuous manner.

4. An article made from the method according to claim 1.

5. An article according to claim 4 having an average surface reflectance of less than about 2% from 450 to 650 nm.

6. An article according to claim 4 comprising a Fresnel lens.

7. A method of making a nanostructure according to claim 1, wherein the substrate comprises polymeric material, an inorganic material, an alloy, or a solid solution.

8. A method of making a nanostructure according to claim 7, wherein the polymer comprises poly(methyl methacrylate), poly(ethylene terephthalate), polycarbonate, triacetate cellulose, cyclic olefin copolymers, nylon, polyimide, fluoropolymers, polyolefins, polysiloxane, siloxane copolymers, or polyurethane.

9. A method of making a nanostructure according to claim 7, wherein the substrate comprises a transparent polymer.

10. A method of making a nanostructure according to claim 1, wherein the masking layer is the reaction product of plasma chemical vapor deposition using a reactant gas comprising a compound selected from the group consisting of organosilicon compounds, metal alkyls, metal isopropoxides, metal oxides, metal acetylacetonates, and metal halides.

11. A method of making a nanostructure according to claim 10, wherein the organosilicon compounds comprise tetramethylsilane, trimethylsilane, hexamethyldisiloxane, tetraethylorthosilicate, or a polyhedral oligomeric silsesquioxane.

12. A method of making a nanostructure according to claim 10, wherein the metal alkyls comprise trimethylaluminum, tributylaluminum, tributyltin, or tetramethyl gallium.

13. A method of making a nanostructure according to claim 10, wherein the metal isopropoxides comprise titanium isopropoxide, or zirconium isopropoxide.

14. A method of making a nanostructure according to claim 10, wherein the metal acetylacetonates comprise platinum acetylacetonates, or copper acetylacetonate.

15. A method of making a nanostructure according to claim 10, wherein the metal halides comprise titanium tetrachloride, or silicon tetrachloride.

16. A method of making a nanostructure according to claim 2, wherein the fluorocarbons are selected from tetrafluoromethane, perfluoropropane, and combinations thereof.

17. A method of making a nanostructure according to claim 2, wherein the gas further comprises argon.

18. A method of making a nanostructure according to claim 1, wherein the nanostructure has a dimension of less than about 400 nanometers.

19. A method of making a nanostructure according to claim 18, wherein the nanostructure has a dimension of less than about 40 nanometers.

* * * * *